US006163613A

United States Patent [19]

Cowans

[11] Patent Number: 6,163,613

[45] Date of Patent: Dec. 19, 2000

[54] LOW-DISTORTION LOUDSPEAKER

[76] Inventor: Kenneth W. Cowans, 1718 E. Sandalwood Ave., Fullerton, Calif. 92635

[21] Appl. No.: 08/494,492

[22] Filed: Jun. 26, 1995

[51] Int. Cl.[7] ..................................................... H03G 11/00

[52] U.S. Cl. .............................................. 381/55; 381/111

[58] Field of Search ................................ 381/98, 99, 194, 381/111, 117, 55, 397, 396, 409, 189

[56] References Cited

U.S. PATENT DOCUMENTS

| | | | |
|---|---|---|---|
| 2,826,644 | 3/1958 | Pease | 381/109 |
| 3,697,692 | 10/1972 | Hafler | 381/18 |
| 4,093,822 | 6/1978 | Steinle | 381/99 |
| 4,593,405 | 6/1986 | Frye et al. | 381/99 |
| 4,912,086 | 3/1990 | Enz et al. | 381/188 |
| 5,357,586 | 10/1994 | Nordschow et al. | 381/199 |

*Primary Examiner*—Vivian Chang
*Attorney, Agent, or Firm*—Jones, Tullar & Cooper PC

[57] ABSTRACT

A loudspeaker driver of the dynamic type is designed to be as efficient as possible within only the constraints of cost and material limitations. The resistance of the speaker's voice coil is designed to have only a portion of the total resistance. An external resistor is wired in series with the voice coil to optimize the speaker for use in systems for sound reproduction. The external resistor is placed so that heat dissipated in the external resistor cannot significantly influence the temperature of the voice coil. The external resistor can be made of pure metal, alloys, carbon or use a temperature-dependent diode for the resistor. Different advantages are found in each embodiment. The invention reduces the effects of voice coil heating, inductance and the negative effects of interaction between voice coil and currents in the central pole piece of the loudspeaker. The separate resistor can be used in conjunction with other resistors and/or reactors placed in parallel with the separate resistor to overcome dips in the speaker's frequency response. Loudspeakers made in accordance with the invention have a perceived quality equal to or better than other types, for example electrostatic, ribbon or planar array, that are normally considered to be superior to the dynamic loudspeaker. The usual advantages obtained with the electro-dynamic speaker of small size, dynamic quality and good efficiency are retained in speakers using the invention.

28 Claims, 5 Drawing Sheets

LOW-DISTORTION LOUDSPEAKER

BACKGROUND

1. Field of the Invention

This invention relates to dynamic loudspeakers used for the reproduction of sound.

2. Discussion of Prior Art

With the demand for constantly increasing quality in reproduced sound, particularly for musical reproduction, the requirements for low distortion in replicating elements such as loudspeakers has increased as well. This has resulted in the scientific community discovering that certain distortions, previously considered inaudible, can be discerned by the human ear to the detriment of the sound quality. Each improvement in the quality of one component, such as electronic amplifiers, places increasing demands on the requirements for other components in the reproduction chain.

In accordance with current practice, the most common loudspeaker transducer employed in home reproduction systems and many theater installations is the electro-dynamic type, sometimes called simply the dynamic type. This is the most inexpensive kind of speaker. It is rugged and reliable, and its efficiency is acceptably high for home and most theater uses. It can reproduce sound over a large frequency band.

The main limitation of the electro-dynamic speaker is its perceived quality. This is considered inferior to the quality exhibited by other kinds of transducers such as electrostatic speakers, magnetic planar array devices and ribbon speakers. These latter types are considered to produce sound more accurate than that reproduced with dynamic speakers.

The electro-dynamic speaker is used more than any other, because it is far cheaper than any of the speakers that have the reputation of higher quality. The electro-dynamic speaker can also radiate more sound power in a typical installation volume than can any of the kinds of speakers that have a reputation for higher quality. Thus its advantages normally outweigh the dynamic speaker's reputation for inferior quality.

A typical system designed to reproduce substantially all the sound frequencies audible to the human ear will use two or more dynamic speakers. Each speaker will be designed to perform optimally within a specified frequency bandwidth. Each speaker will be supplied frequencies within its frequency band with use of a dividing network or crossover network.

A common system uses a dynamic speaker with a conical radiator 5.5" in diameter to cover the frequencies from 60 Hz to 3,000 Hz. Another speaker with a dome-shaped radiating surface 1.0" in diameter radiates frequencies from 3,000 Hz to 20,000 Hz. The signal from the electronic amplifier that is driving the speaker system is divided into two frequency bandwidths by use of a cross-over network consisting of electrical elements such as inductors, capacitors and resistors. Three or more speakers can be used to cover the entire audio band with the use of more complicated cross-over networks. Each of the three or more speakers radiates sound within a narrower band of frequencies than when only two speakers are used. When electro-dynamic speakers emit sound straight into the room they are called direct radiator speakers.

The electro-dynamic speaker can be made more efficient than it usually is. If this is done the overall clarity and forceful character of the sound reproduced by the speaker will be enhanced. This is mainly because of the influence of voice coil heating. As power is applied to the speaker any inefficiencies are dissipated as heat in the coil. A speaker with more efficiency heats the voice coil less. The added efficiency, however, can only be attained at the expense of a reduction in frequency response bandwidth in a dynamic speaker if the system size is held constant.

The design of any particular electro-dynamic speaker for use in a high quality system is a carefully chosen balance among all the design factors. It is necessary to trade off the parameters of efficiency, clarity, frequency bandwidth, cost and size in any particular design. Enhancement of one consideration can generally be made only at the expense of the others.

The trade off is not a simple one. If the advantages of increased clarity and efficiency are utilized in a particular installation it is necessary to use more speakers to cover the entire audible band than if the speakers had been designed with a lower efficiency but with a correspondingly larger useful bandwidth. The degradation in quality engendered by the use of more crossover network elements and different placements of the sound source as different frequencies are reproduced can overshadow the increase in quality obtained with the added clarity brought about with higher efficiency. More efficient speakers are also larger.

OBJECTS AND ADVANTAGES

The object of the invention is to minimize or eliminate the quality deficiencies that are current in dynamic loudspeakers. The invention does so by lessening or abolishing the prime causes of these flaws; failings in voice coil design and execution. The voice coil is the main or sole reason for the dynamic speakers's lacks of quality. Heating of this, with attendant increase in resistance is only the most obvious flaw. Inductance of the coil is another fault that requires even more drastic compromises in the design of the cone. Efficiency losses due to a transformer effect within the voice coil assembly also degrade the speaker.

The invention minimizes or eliminates all the problems with the voice coil. Effects of heating are reduced by more than tenfold. Complete eradication of these effects is even possible in some embodiments. Inductance is minimized at least fourfold and can also be nearly abolished with proper design of the invention. Distortions due to the transformer effect are also minimized.

Further advantages are also a part of the invention. Frequency response of a speaker using the invention can be smoothed out with the application of electronic circuit techniques in a way that is not possible with conventional speakers.

Systems in accordance with the invention utilize a new embodiment of an electro-dynamic speaker to greatly minimize some flaws in conventional speakers. These flaws in the conventional speaker introduce errors in sound reproduced through the speaker. Minimizing these flaws allows a higher quality of perceived reproduced sound to be obtained. The sound quality obtained by the use of this design is comparable or superior with speakers of the electrostatic or other types that are normally considered to be superior in quality to the dynamic speaker. The electro-dynamic speaker made with these techniques retains all the advantages of the conventional embodiment: These are small size, large power radiated, ruggedness, reliability and lower cost than other types of speakers.

BRIEF DESCRIPTION OF THE DRAWINGS

A better understanding of the invention may be had by reference to the following description, taken in conjunction with the accompanying drawings, in which.

CONVENTIONAL CURRENT DESIGN TECHNIQUES

Figure 1:
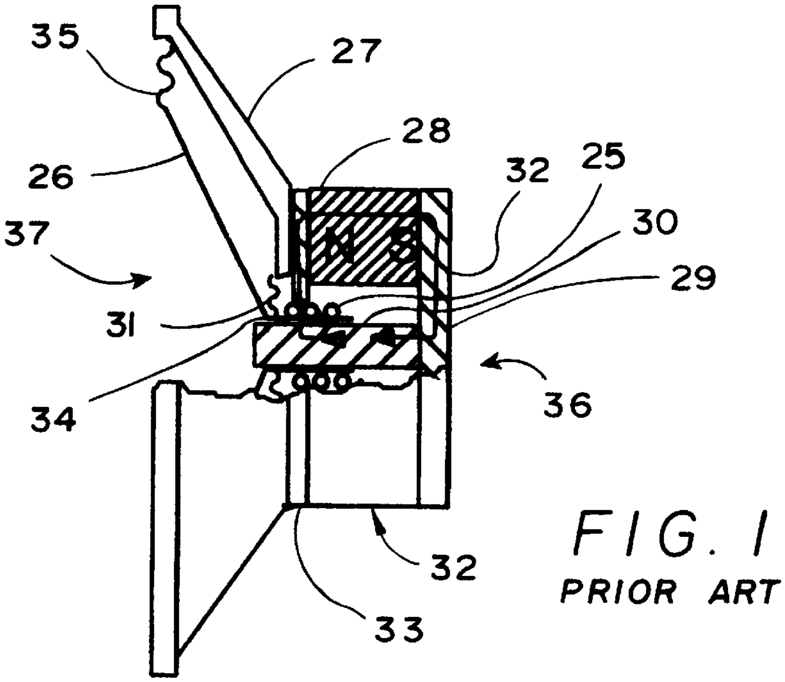
FIG. 1 PRIOR ART
FIG. 1 shows the electro-dynamic speaker in its usual form.

FIG. 1 shows a conventional electro-dynamic speaker 36. It consists of a permanent magnet circuit assembly 32, a voice coil 25 and a radiating surface 26 attached to the voice coil. The radiating surface is usually in the shape of a cone.

Figure 2:
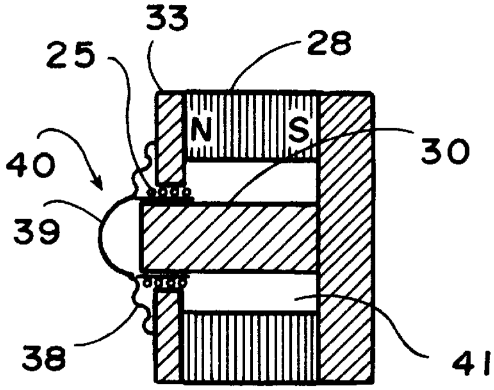
FIG. 2 PRIOR ART
FIG. 2 shows an electro-dynamic speaker in another form used mainly for reproducing higher frequency sounds.

Another conventional kind of electro-dynamic speaker is shown in FIG. 2. This type is generally known as a dome speaker. The dome speaker is most often used as a radiator of sound typically above 1000 Hz. The shape of the radiating surface of a dome radiating assembly 40 is the only basic difference between the dome speaker and the more conventional cone unit.

Figure 3:
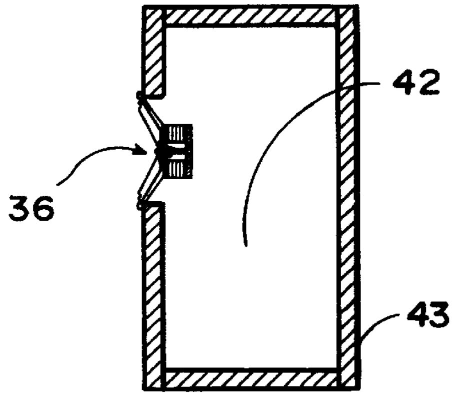
FIG. 3 PRIOR ART
FIG. 3 shows a cross-sectional view of an electro-dynamic speaker mounted in a closed box.

FIG. 3 shows the cone speaker mounted in a box. This is a typical way of using the speaker in a system. A box 43 prevents low frequency sound from the speaker's back from cancelling the front sound.

Figure 4:
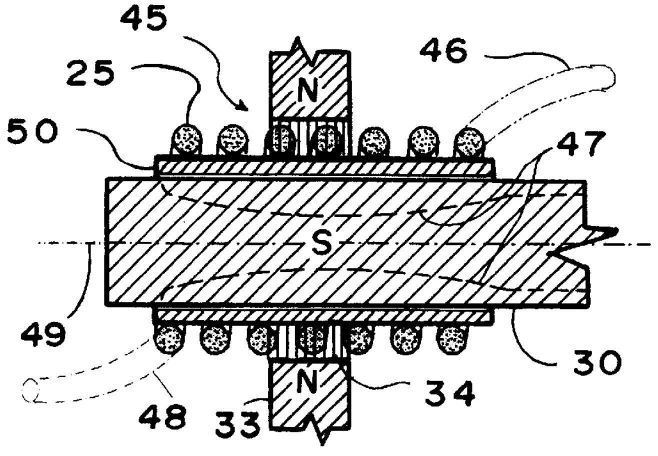
FIG. 4 PRIOR ART
FIG. 4 shows a cross-sectional view of voice coil construction used in electro-dynamic speakers.

A conventional electro-dynamic speaker shown in FIG. 1 has magnetic circuit 32, which consists of a permanent magnet 28, an outside pole piece 33, a central pole piece 30 and an end connector 29. All of these are fabricated of permanent magnet or ferromagnetic materials. A magnetic field 34, illustrated more clearly in FIG. 4, is induced across the gap between external pole piece 33 and central pole piece 30. Voice coil 25 is placed within this magnetic field. Current is passed through voice coil 25 through an electrical lead 46 and a lead 48 shown in FIG. 4.

The design of an electro-dynamic speaker is a complicated task. It is necessary to take into consideration the basic parameters of: (The symbols and units at the right are those normally accepted by the technical community.)

- Resistance of voice coil 25 shown in FIG. 1. $R_{VC}$, ohms
- Inductance of voice coil 25. L, Henrys
- Length of the wire in voice coil 25 that is immersed within magnetic field 34. 1, meters
- Resonant frequency of the speaker when not mounted in a box or baffle. $f_0$, Hertz
- Resonant frequency of the speaker when mounted in a box or baffle. $f_{res}$ Hertz
- Height of voice coil 25 along the direction of a center-line 49 shown in FIG. 4. h, meters
- Height of magnetic field 34 along the direction of voice coil center-line 49 shown in FIG. 4. $H_E$, meters
- Mass of the moving assembly. This includes voice coil 25 and a voice coil former 50 shown in FIG. 4, cone 26 or a dome 39 radiating surface shown in FIGS. 1 and 2, the moving portion of a flexible surround 35 in FIG. 1 or 38 shown in FIG. 4 and the moving part of a spider 31 supporting the voice coil. Also included is the mass of air in contact with cone 26. $M_{MD}$, kilograms
- Area of the radiating surface. $S_B$, meters$^2$
- Strength of magnetic field 34 crossing windings 25 shown in FIG. 4. B, Teslas
- Total magnetic flux in magnetic circuit 32 shown in FIG. 1 that crosses voice coil windings 25. $\phi$, Webers
- The compliance of the structure that supports cone 26 or dome 39 shown in FIGS. 1 and 2. This consists of the total mechanical compliance of surround 35 or dome surround 38 along with the mechanical compliance of spider 31 as well as the pneumatic compliance of a volume 42 of enclosure 43 shown in FIG. 3 which forms the environment to which the speaker radiates the sound wave emanating from the reverse side of cone 26 or dome 39. Enclosure 43 is normally constructed of wood or a similar material when used with a cone speaker 37. An enclosed volume 41 for the dome type speaker shown in FIG. 2 is usually constructed integral with the speaker itself. C, meters/newton
- The electrical impedance of an amplifier 58 shown in FIG. 7 driving the speaker. In practically all contemporary installations this is very close to zero. There are, however, sometimes reasons to have a value different than zero for this. The sum of the resistance of voice coil 25 shown in FIG. 1 and the impedance of driving amplifier 58 with a set of wires 60 shown in FIG. 7 connecting amplifier 58 with speaker 57 forms a damping circuit which slows any velocity of a voice coil assembly 45 shown in FIG. 4. $Z_{amp}$, ohms
- The efficiency, or more correctly the sensitivity, of the speaker. This is the amount of sound pressure at a distance of one meter from the speaker relative to 0.0005 newton/square meters that will result with one watt of nominal power provided to the speaker. This is usually specified as the amount of power generated when 2.83, which is the square root of 8, volts of signal are applied across the voice coil. This is because the nominal standard impedance of speakers for the home is 8 ohms. Thus the square root of 8 volts applied to a standard voice coil will supply 1 nominal watt of electrical power. η, decibels/watt The maximum amount of electrical power that the speaker can accept from the amplifier driving the speaker is a significant design parameter. W. watts All these parameters interact in the performance of an electro-dynamic loudspeaker. The complete task of executing a successful design is a laborious task. Some of the basic outlines of this are delineated in; Morse, Philip M. *Vibration and Sound*. New York: McGraw-Hill, 1936; p. 273–277.

The main parameters addressed by this invention are the resistance of the voice coil R, its inductance L, its length l and the speaker efficiency or sensitivity η. The amount of power W that the speaker can handle is significantly increased as a corollary result of this invention as well.

Tradeoffs Involved in Loudspeaker Design

Conventionally, the efficiency of a dynamic speaker system is determined by the combination of the frequency response bandwidth desired together with the needed size of the speaker system. This size includes speaker enclosure 43 shown in FIG. 3. Volume 42 within this enclosure is one of the critical parameters that determines the efficiency in conjunction with the speaker bandwidth.

The physical parameters defining the radiation of sound dictate that the volume of air that the system must move during each cycle of sound for a given radiated power increases as the frequency of the sound decreases. This fact means that the power needed to produce a given level of sound will increase as the lowest frequency in the speaker system's capability is decreased for a given volume 42. The reason for this is that the lowest frequency that can be radiated from a dynamic speaker is near the resonant frequency of the system. This frequency is equal to:

$$f = \frac{1}{2\pi}\sqrt{\frac{1}{M_{MD}C^*}} \quad \text{Equation 1.}$$

where f equals the resonant frequency, $M_{MD}$ equals the moving mass of the speaker, C* is the compliance supporting the moving part of the speaker including the effect of any closed cavity volume 42 behind the speaker as shown in FIG. 3. In systems using cone speakers C* is comprised mostly of the cavity effect. C* is proportional to the total volume of cavity 42.

With volume 42 fixed the only way that this resonant frequency can be decreased for a given size of speaker 36 is to increase the mass $M_{MD}$. The energy required to move this mass to a given velocity increases as the square of the mass. Thus more energy will be needed for the same sound output as the lowest usable frequency is reduced.

The efficiency, or sensitivity, of a total system using two or more electro-dynamic speaker drivers is normally determined by the efficiency of the speaker in the system having the lowest efficiency. This is because most speaker systems are designed to be driven by a single amplifier. If a high frequency speaker of high efficiency is used in conjunction with a low frequency, low efficiency, speaker in a single system it is necessary to adjust the efficiency downwards of the high frequency speaker with an electronic network.

Figure 5:
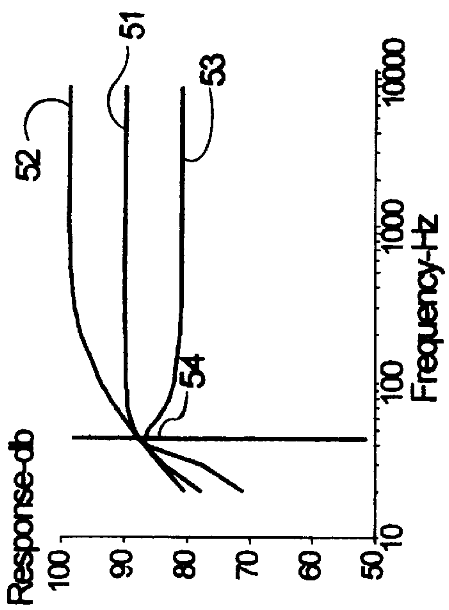
FIG. 5 PRIOR ART
FIG. 5 shows idealized frequency responses of conventional electro-dynamic loudspeakers.

The balance amongst efficiency, frequency response and size can be explained with reference to FIG. 5. FIG. 5 shows a frequency response 51 of an optimally designed electro-dynamic loudspeaker, a response 52 of a speaker designed for high efficiency and a response 53 of a speaker designed with too low efficiency. At the frequency of resonance 54, shown as 42 Hz in FIG. 5, the response is nearly equal to that at much higher frequencies in optimal response 51. Optimally the response at resonance is about 3 to 6 db below the response of the speaker at higher frequencies. The responses shown are for speakers mounted in a closed box. If volume 42 in FIG. 3 is so constructed to have a port connecting the inside of volume 42 with the air outside the box the responses will be different and more complicated to analyze. The arguments presented herein will not be altered if the analysis is extended to speakers mounted in ported boxes.

Response 52 is that of a speaker having the same resonance frequency of 42 Hz as that of a speaker with response 51 and which is designed with almost all the same parameters. The only difference is in the strength of the driving magnetic motor. For this example the magnetic system of the speaker whose performance is shown in response 52 will be designed to have:

$$(Bl)_{response52} = 3.16(Bl)_{response51} \quad \text{Equation 2.}$$

where B is the strength of the magnetic field 34 shown in FIG. 4 and l is the length of wire in voice coil 25 immersed in the magnetic field.

The speaker having response 53 has magnetic circuit product Bl lower than the speaker of response 51 by the same ratio of 3.16. The efficiency of a dynamic speaker is proportional to $(Bl)^2/R$; where R is the resistance of the voice coil circuit.

The difference in low frequency power between response 51 and response 52 occurs due to the phenomenon of damping. As the speaker moves, attempting to reproduce a low frequency, the effect of voice coil 25 shown in FIGS. 1 and 4 moving through magnetic field 34 induces a voltage across voice coil 25. This voltage cause a current to flow in the wire of voice coil 25. The energy that is dissipated by this process causes a force to be exerted on moving cone assembly 37 resisting its motion. This force will impede output of the speaker at all frequencies below that frequency at which the reactance to motion of the moving mass $M_{MD}$ plus any other viscous or other resistance to velocity of cone assembly 37 approximately equals the total resistance to motion caused by the electrical damping force just described. $(Bl)^2/R_{VC}$ is also the damping factor for a speaker at the frequency of resonance. It is thus easy to see that a highly efficient speaker is also highly damped. This explains the relationship amongst the three response curves of FIG. 5.

The optimum response 51 results when a speaker is designed such that the relationship given below is within the limits shown.

$$1.4 \le \frac{(Bl)^2}{R_\Sigma M_{MD} 2\pi f_{res}} \le 2 \quad \text{Equation 3.}$$

where B is the magnetic flux density in voice coil gap 34, l is the length of the voice coil in gap 34, $R_\Sigma$ is the total resistance in the voice coil circuit, $M_{MD}$ is the total moving mass of the loudspeaker, and $f_{res}$ is the resonant frequency of the speaker mounted in a system. If the factor given in the above equation is less that 1.4 the response becomes like response 53 in FIG. 5. If the same factor is more than 2 the response tends to that of response 52.

The low frequency response loss of response 52 shown in FIG. 5 compared to that of 51 results in one advantage. The speaker having the increased Bl product will require only one tenth the power being dissipated in the voice coil of response 52 compared to that of the speaker with response 51 at frequencies much higher than resonance 54 for equivalent radiated sound power. In FIG. 5 this is shown in response 52 at frequencies of 300 Hz and higher.

The Impact of Voice Coil Heating

Power dissipated in voice coil 25 generated due to the current flowing to produce a force on the speaker heats the voice coil. The temperature of the voice coil varies as the signal to the speaker changes.

Figure 6:
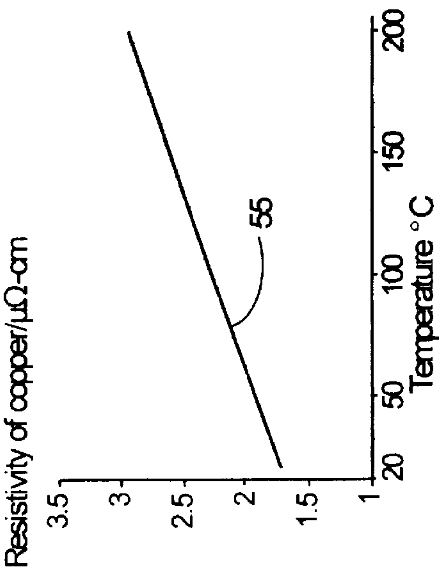
FIG. 6 PRIOR ART
FIG. 6 shows the variation of the electrical resistance of copper as its temperature changes.

FIG. 6 shows a curve 55 for the resistivity of copper as a function of temperature. All pure metal conductors display this same characteristic. The resistivity of a pure metal will be approximately proportional to its absolute temperature. This means that the resistance of the voice coil varies as its temperature changes. Certain alloys containing several metals, such as for example constantan, do not display this temperature-dependant resistance characteristic to the same degree as do pure metals. The resistance of these alloys is ten to twenty times higher than that of pure metals, however. This fact eliminates their use as conventional voice coil conductors since they would have to be ten or twenty times as heavy as their copper equivalent to be of the same resistance in an equivalent length as the copper coil.

As the resistance of the voice coil changes the output of the speaker also changes. At frequencies about 2 to 4 octaves above resonance the output of the speaker will decrease in direct proportion to the rise in voice coil resistance. Near the resonant frequency output increases. This occurs because the increased resistance brought about by voice coil heating decreases damping applied to the speaker. As the voice coil of the speaker having response 52 shown in FIG. 5 is heated the frequency response will become closer to that of the speaker with response 51.

Thus both the output and the frequency response of an electro-dynamic speaker varies as its voice coil resistance changes. Voice coil resistance alters as the signal from the source provides differing amounts of power to the speaker. This is a severe limitation to the achievable quality of a dynamic speaker. Minimizing this effect is currently possible only by compromising other parameters of the design such as flat frequency response, size of the speaker system, maximum power capability as well as others.

Even if these parameters are compromised to the maximum amount the effect is limited. A practical ceiling to the efficiency or sensitivity of direct radiator speakers is about 96 db. This is 10 times the efficiency of the typical high quality speaker used for reproduction of music in the home. The heating of the voice coil in this hypothetical high efficiency speaker would be about one tenth that experienced in a typical speaker with 86 db efficiency or sensitivity. The variation in output would be only about 1 db in the efficient speaker instead of 4.7 db at maximum power input, but a variation of 1 db is still audible. This improvement would be gained at the expense of a speaker ten times the volume of the typical home speaker and the cost would be increased in like proportion or even more.

Designers of conventional speakers have been aware of this problem. Attempts to cool the voice coil have been used. These include methods of direct cooling such as coating the coil for better radiation effects and the incorporation of ferro-magnetic fluids to transfer heat from the coil to the immediately adjacent ferromagnetic pole pieces 33 and 30 shown in FIGS. 1 and 2. All these techniques are hampered by the fact that the heat of the voice coil is generated in a small confined space from which it is very difficult to extract heat with any significant effectivity. It is also true that cooling the voice coil with ancillary techniques such as ferro-magnetic fluid usually adversely affects the quality of the reproduced sound.

SUMMARY OF THE INVENTION

An electro-dynamic speaker is constructed with a portion of the electrical resistance of its voice coil in the form of a resistance wired in series with the speaker voice coil but mounted separate from the voice coil. The extra resistance is placed such that any heat generated within the external resistor will not substantially influence the temperature of the voice coil. A magnet structure that is considerably stronger than is now considered optimum is employed in conjunction with this extra resistance. The two factors of extra resistance and extra magnetic strength, with less wire in the voice coil, combine to provide a speaker having the same efficiency and frequency bandwidth as conventional units deliver today but with a vastly improved quality perceivable by the human ear.

The series resistance can be fabricated of material that displays a positive, negative or neutral temperature-resistance coefficient. In some embodiments the external resistor is fabricated of a conventional metal conductor, typically copper or aluminum, in conjunction with means to cool the external resistor so as to maintain its temperature substantially constant. In other embodiments the external resistor is fabricated of carbon resistors or semiconductor diodes that display a negative temperature coefficient of resistance. The use of these materials compensates for the increase of resistance undergone in the voice coil as it heats up due to power generated within the voice coil. In still other embodiments the external resistor can be constructed of a metal alloy such as constantan which displays a neutral temperature coefficient of resistance. In yet other embodiments the output impedance of the amplifier driving the speaker can be used as part or all of the added resistance.

DETAILED DESCRIPTION OF THE INVENTION

Figure 7:
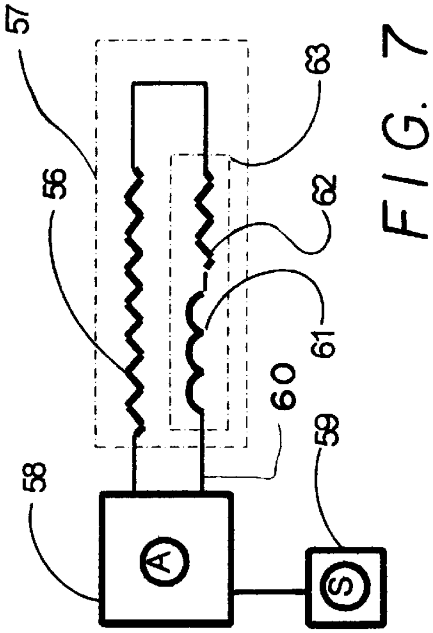
FIG. 7 shows a schematic representation of the electrical circuit of the invention.

FIG. 7 shows a schematic diagram of a sound system which uses the invention. A signal source 59 is used to provide drive to amplifier 58 capable of providing enough power to the speaker. The power is delivered to the dynamic speaker whose voice coil circuit 57 is shown in FIG. 7 through connecting wires 60. A speaker voice coil 63 is connected in series with a resistor 56 mounted outside the voice coil installation. The speaker is designed so that the parameter:

$$\frac{(Bl)^2}{R_{VC}M_{MD}2\pi f_{res}} > 2 \qquad \text{Equation 4.}$$

where $R_{VC}$ is the resistance of the voice coil. Resistance 56, when added to $R_{VC}$ equals $R_\Sigma$ in equation 3 and makes the ratio within the limits given in Equation 3.

The subject invention significantly minimizes the effect of the problem posed by voice coil heating. An electro-dynamic speaker is constructed to have as strong a magnetic circuit as possible within the restraints imposed by cost and material parameter considerations. The voice coil of this speaker is so constructed to have only a portion of the total design resistance, as shown by a resistor 62 shown in FIG.

7, of the speaker. The remainder of the resistance is contained in resistor 56 connected in series with the voice coil. The total impedance of the speaker is thus isolated from the effects of temperature variation of the voice coil by two effects.

The first effect is that of high efficiency. By constructing a dynamic speaker with higher efficiency, brought about by the strong magnetic circuit, than that of a conventional speaker the temperature swings will be diminished in proportion to the increase of efficiency. As an example; if a speaker were to be designed with a magnetic field twice that of a comparable conventional speaker the temperature variations due to power input to the speaker with the higher magnetic field would be reduced fourfold, because the efficiency of the speaker with the stronger magnet would be four times the efficiency of the conventional speaker.

The second effect is due to the presence of series resistor 56. If the hypothetical new speaker discussed above were to be constructed with a voice coil having an impedance of one quarter of the total desired impedance, together with series resistor 56 of three-quarters of the total impedance, the total swings of resistance due to temperature changes would be only one-sixteenth that of the conventional speaker. The temperature of the voice coil would vary only one quarter as much due to the fourfold increase of efficiency. The resistance change relative to the total speaker resistance of 62 plus added resistor 56, in FIG. 7, would be diminished. Resistance 62 is only one-quarter that of the conventional speaker's voice coil. The combination of one quarter the temperature change with one quarter of the total resistance in the voice coil results in only one-sixteenth of the percentage change of that undergone by the conventional speaker in this hypothetical example. The efficiency of the hypothetical new speaker would be exactly equal to the conventional speaker used as an example. The added fourfold increase of efficiency is balanced by the fact that three-quarters of the power supplied to the new speaker is dissipated in added external resistor 56 and thus does not contribute to the sound of the speaker.

External resistor 56 can be constructed in various embodiments depending on the desired result. If external resistor 56 is constructed of a pure metal such as copper it is necessary to design this so that cooling is applied to the external resistor sufficient to maintain its temperature substantially constant. It is possible to do this with adequate effectivity because the volume of the added resistor is not constrained to be confined within the magnetic field. Additionally the mass of added resistor 56 is of no importance since it does not move.

Figure 8:
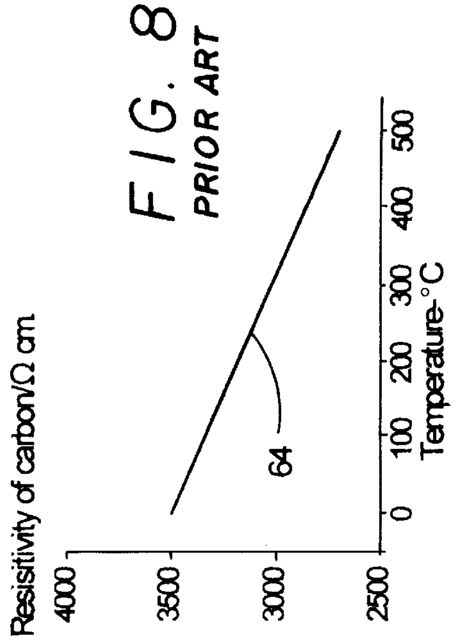
FIG. 8 PRIOR ART
FIG. 8 shows the variation of the electrical resistance of carbon as its temperature changes.

If external resistor 56 is constructed of materials such as conventional carbon resistors used for electronic circuits the circuit can be so designed to reduce even the small residual resistance shift remaining when the highly efficient magnetic circuit with a low impedance voice coil is used with an external resistor. If external resistor 56 is fabricated of carbon shown in FIG. 9 as a resistor element 65, denoted as the word Carbon within an ellipse, it will have a resistivity relationship with its temperature as shown in FIG. 8. It can be seen in FIG. 8 that a curve 64 of the resistivity of carbon changes with temperature in opposite manner to that of copper. As carbon heats up its resistivity decreases whereas that of copper increases under the same conditions. If external carbon resistor 65 is designed correctly the voice coil heating, which results in an increase of the voice coil resistance, will be exactly balanced by the decrease of the carbon resistance brought about by the raise in temperature of the external carbon resistor 65. In this way the total resistance of voice coil plus external resistor remains constant.

Figure 9:
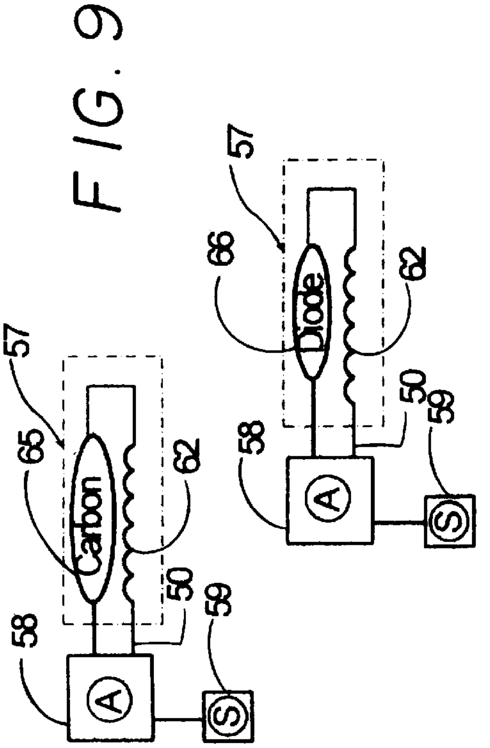
FIG. 9 shows two alternate embodiments of the invention.

There are also diodes that have a temperature-resistance coefficient with the same characteristics as carbon but of a higher order. These can be used for the external resistor as shown in FIG. 9 instead of carbon in order to keep the total resistance constant. A diode 66, shown in FIG. 9 and denoted as the word Diode within an ellipse, depicts the use of a diode in place of resistor 56 or 65.

Figure 10:
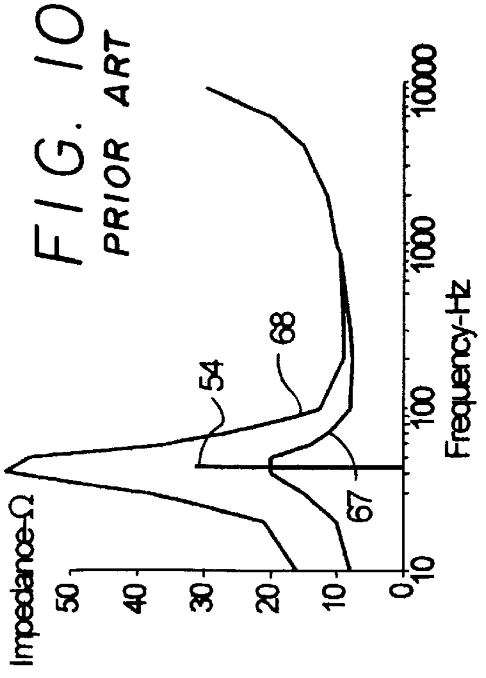
FIG. 10 PRIOR ART
FIG. 10 shows the impedance characteristic of typical electro-dynamic loudspeakers.

The use of the invention also helps another aspect of electro-dynamic speaker performance. The inductance of the voice coil is generally an undesirable parameter. It is usually desirable to minimize the value of inductance as much as possible. The effect of inductance on speaker performance can be seen with respect to FIG. 10. It can be seen here that an impedance 67 of the voice coil, for the optimum efficiency speaker whose response 51 is shown in FIG. 5, or a high efficiency speaker impedance 68 corresponding to response 52 rises at frequencies higher than 200 Hz and rises extremely rapidly at frequencies over 1000 Hz.

In a conventional design the effort to reduce inductance is limited by the need for voice coil area to radiate heat to the surrounding environment to rid the coil of dissipated energy. It is possible to increase the magnetic field in a conventional design while simultaneously shortening the length of voice coil wire used. Substantially the same performance with a lowered inductance will be thus obtained. The shorter wire used to form the voice coil will present a smaller total area available to radiate heat from the coil if all other parameters are held constant. The voice coil wire will also be much smaller and lighter. This degrades the ability of the speaker to take high power surges without burning out. The basic relationship that determines this is:

$$R = \rho \frac{l}{s} \qquad \text{Equation 5.}$$

where R is the resistance of the voice coil, ρ is the resistivity of the voice coil material, l is the length of the voice coil and s is the crossectional area of the wire used to make up the voice coil. For a given resistance of the voice coil, a reduction in l, the length of wire used, brought about by an increase in magnetic field flux density would require that s be reduced proportionally. This creates a very fragile voice coil with little area for radiation of heat.

The use of the invention minimizes the problem of achieving a low inductance. Reducing the impedance of voice coil 63 shown in FIG. 7 without minimizing the amount of material used in the voice coil simultaneously reduces the inductance of the voice coil without reducing the area for radiation or the ability of the coil to withstand surges of power. In the relationship given above R is reduced with the invention as the length is also reduced. As shown in the discussion of the hypothetical speaker above a given ratio increase of magnetic flux density, B, gives rise to a reduction of voice coil resistance, R, in amount of the ratio squared. The net effect is that the amount of mass in the voice coil wire of a speaker using the invention stays the same while the inductance decreases.

The speaker using the invention will be able to produce the required acoustic power with less electrical power dissipated in voice coil 63. The diameter of the coil wire used will also be larger. This also helps the coil withstand surges of power without burning out.

Design of a Speaker Using the Invention

To illustrate how a loudspeaker is to be designed with this invention a comparison will be made with an existing speaker now being used. The performance characteristics will be compared with a design using the invention to show the difference in output, impedance and the propensity for heating the voice coil.

The speaker chosen for this example is the HIF 17 JS made by the Audax company. This model is a popular driver used in many highly regarded speaker systems. It is generally employed in these speaker systems as the driver to radiate frequencies from 40 Hz to 3,000 Hz. It will be quite often be used with box 43 having volume 42 of about 30 liters. In this size box the speaker will resonate at around 60 Hz. The characteristics shown in FIG. 12 and the following table are copied from the Audax catalog. The basic performance parameters are:

| | | |
|---|---|---|
| Resonant frequency (unmounted in free air) | 29 | Hz |
| Voice coil inductance | .0007 | Henry |
| Voice coil resistance | 6.5 | ohms |
| Minimum voice coil impedance | 8.0 | ohms |
| Magnetic field strength | 1.02 | Tesla |
| Mass of permanent magnet | .348 | Kilogram |
| Efficiency or sensitivity | 89 | db/watt |
| Magnetic motor strength (B1) | 6.67 | Tesla-meters |
| Nominal power rating | 30 | watts |

Using the invention some of the above parameters would be changed as follows:

| | | |
|---|---|---|
| Voice coil inductance | .0002 | Henry |
| Voice coil resistance (without added resistor 56) | 1.6 | ohm |
| Voice coil resistance (including added resistor 56) | 7.7 | ohm |
| Resistance of added resistor 56 | 6.1 | ohm |
| Minimum voice coil impedance (without added resistor 56) | 1.9 | ohm |
| Minimum voice coil impedance (including added resistor 56) | 8.0 | ohm |
| Magnetic field strength | 1.82 | Tesla |
| Mass of permanent magnet | 1.39 | Kilogram |
| Efficiency or sensitivity (without added resistor 5) | 95.6 | db |
| Efficiency or sensitivity (including added resistor 56) | 89 | db |
| Magnetic motor strength (B1) | 6.67 | Tesla-meters |
| Nominal power rating | 120 | watts |

The comparison between the Audax speaker and a modified Audax speaker using the invention is an artificial comparison. Such parameters as an extensive resonance peak 75 in FIG. 12 would make the actual modification impractical. This discussion will ignore such effects to show how a speaker is designed using the invention. This will be done by simple extrapolation of the Audax speaker parameters.

As the effective magnetic field strength is raised by a ratio of 1.8 the length of wire in the voice coil will be reduced by $1.8^2$, or 3.24, in order to maintain the same sensitivity with a total impedance 8 ohms of voice coil 25 plus added resistor 56.

Figure 12:
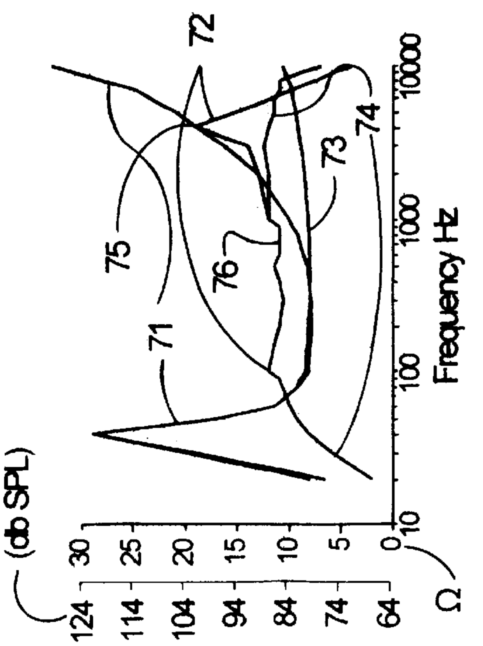
FIG. 12 shows comparisons between operating parameters of a conventional speaker and those of an equivalent speaker that uses the invention.

FIG. 12 shows performance parameters of the standard Audax speaker unit and the same parameters of a unit designed with the invention to provide substantially the same output as the Audax HIF 17 JS.

In FIG. 12 a frequency response 72 of the Audax speaker displays resonance peak 75. The peak occurs at about 4,000 Hz. This peak is a necessary part of conventional design in any speaker designed to cover a frequency range of more than three octaves. The peak derives from the resonance of one or more elements in speaker cone 26 shown in FIG. 1. The peak of the Audax speaker chosen as an example is larger than most. This fact makes this example a good archetype for purposes of illustration.

As the driving frequency approaches 4,000 Hz there is a rise in acoustic output per unit of current passed through the voice coil that results. This is necessary in conventional speakers because a speaker impedance 71 shown in FIG. 12 increases as frequency rises due to inductance of the voice coil. The reduction in voice coil current due to this impedance rise is thus imperfectly cancelled out by the rise in output due to the resonance effects. The disadvantage with this balance is that, as with all resonant effects, the output increase only takes place after three or four complete cycles of music signal. Further, the resonance causes a ringing sound to be radiated after the signal ceases. The resultant transient character of the sound from the speaker is thus degraded.

An impedance 73 in FIG. 12 is that of the voice coil of a speaker designed using the invention. This has less than one third the original inductance. Resonance 75 is not required with a speaker that uses the invention. Frequency response of a speaker whose performance is similar to that of the Audax HIF 17 JS but using the invention would display a response 74 shown in FIG. 12. A speaker without resonant peak 75 will have a better perceived quality than one with it if the frequency response of each is substantially the same. This is due mainly to the increased quality of the transient response of the speaker using the invention.

A small but significant gain of about 1.5 db in sensitivity is added to the Audax speaker with the use of the invention. This is due to the minimizing of currents that flow in pole piece 30 shown in FIG. 4. These currents flow in reaction to the current in voice coil 25. It is as if voice coil 25 is the primary winding of a transformer and the surface of pole piece 30 is the secondary. As current flows in the voice coil a voltage is induced around the surface of pole piece 30 that causes these currents to flow. The depth of these currents near the surface of pole piece 30 are illustrated in FIG. 4 as a surface outline 47. The use of the invention results in fewer turns being placed in voice coil 25. This reduction gives an equal reduction in induced voltage around the surface of pole piece 30. Less energy is dissipated in the currents within outline 47 and the difference is available for sound reproduction. The difference in the two designs of speaker can be noted by comparing the values for voice coil resistance and minimum voice coil impedance in the two tables of specifications given above. The difference in these two values for the unmodified Audax speaker is 1.5 ohms; the difference between 6.5 ohms resistance and 8 ohms minimum impedance. The speaker using the invention shows a difference of only 0.3 ohms. Efficiency loss in the Audax speaker due to this effect is 1.8 db and only 0.3 db in the modified speaker using the invention.

Figure 13:
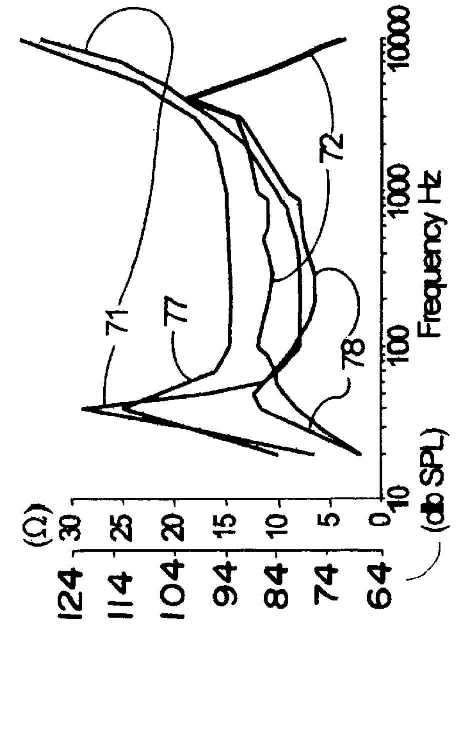
FIG. 13 shows comparisons between operating parameters of a conventional speaker with a voice coil at ambient temperature, with a hot voice coil and the operating parameters of an equivalent speaker that uses the invention.

Response 72 of a conventional speaker as shown in FIG. 12 will result if the speaker is used so that the voice coil is maintained near room temperature. As the speaker is supplied with large amounts of power in reproducing music at a loud level the voice coil will be heated to higher temperatures. This heating changes the resistance of the voice coil and the resultant impedance of the speaker will change. A curve 77 in FIG. 13 shows the impedance of the Audax speaker with its voice coil heated to 400° F. A response 78 in FIG. 13 shows the frequency response that would result if the Audax speaker were to be supplied enough power to heat the voice coil to 400° F. This temperature is often reached with speakers reproducing music at realistic levels. Response 78 is far less level than response 72 of the speaker with a room temperature voice coil. Response 78 shows a dip of 4 db in the middle ranges around 400 Hz due to reduction of current brought about by heating of the voice coil. A rise of about the same amount at the resonant frequency results from the lack of damping due to the same resistance increase. At frequencies over 2,500 the response does not drop off much due to the fact that the inductance of the voice coil is the main determinant of impedance here and this is not affected by temperature.

Low frequency performance of the heated speaker follows the idealized characteristics shown in response 53 of FIG. 4. Frequency response 72 shown in FIG. 13 that was almost level below 2000–3000 Hz for the Audax speaker at room temperature becomes decidedly non-level when the coil is at 400° F. In contrast the speaker using the invention would deviate from its room temperature response by less than ±0.5 db when the coil is heated to 400° F. and it would require more than three times the power to heat the voice coil to 400° F. in the speaker using the invention as it would in the Audax speaker. At the same speaker output the voice coil of the speaker using the invention would heat only to around 180° F.

Figure 11:
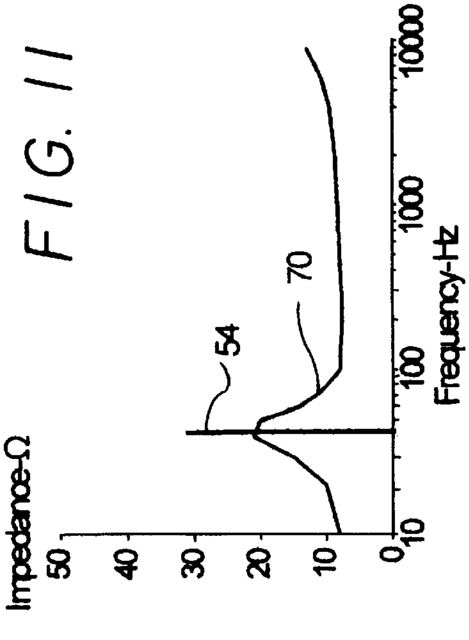
FIG. 11 shows the impedance vs. frequency of a speaker using the invention.
Figure 14:
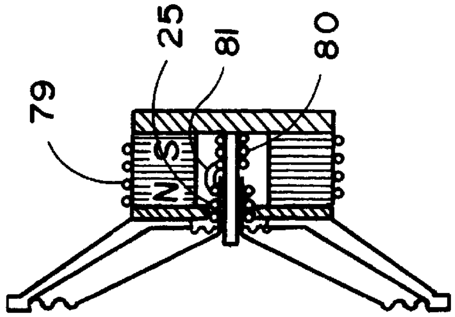
FIG. 14 shows variations of the invention constructed so as to minimize the effect of voice coil inductance.

The invention can be used in other embodiments to further minimize the inductance of the voice coil. FIG. 14 shows this. A portion or all of external resistance 56 shown in FIG. 7 can be placed in wire form around permanent magnet 28 shown in FIGS. 1 or 2. This is shown as a wire 79 in FIG. 14. Wire 79 would be wound so that the current in 79 would act to counteract the magnetic field induced in magnetic circuit 32 shown in FIG. 1. This would partially or completely eliminate the inductance of a voice coil winding 61 shown in FIG. 7. The total inductance of voice coil circuit 57 shown in FIG. 7 would be less than that shown in an impedance 70 shown in FIG. 11. FIG. 14 shows another application of the same induction minimizing technique as a winding 80 wound around the central pole piece 30 shown in FIGS. 1 and 4. If winding 80 shown in FIG. 14 connected to voice coil 25 through connecting wire 81 is wound opposite to voice coil 25 so that the current in 80 induced a magnetic field opposite to that induced by voice coil 25 the inductance of the combination could be reduced. If the number of windings in 80 were equal to those in voice coil 25 the inductance could be brought substantially to zero. This method of reducing the inductance is effective with the use of the invention. If winding 80 were to be placed in the unmodified Audax speaker the difference in impedance between voice coil resistance and minimum impedance would double from 1.5 ohms to 3.0 ohms. This loss in efficiency would not be acceptable in most installations.

The currents that run near the surface of central pole piece 30 in opposite direction to the current in voice coil 25 reduce the inductance of the voice coil. This reduction is not without detriment. The magnetic permeability of the ferromagnetic pole piece 30 varies in time. This variation results in a distortion in voice coil current as the currents within outline 47 vary due to the alteration in transformer effect caused by variations in the value of magnetic permeability. The use of the invention reduces this form of distortion because less current-turns are used in speakers using the invention than in conventional speakers designed with the same efficiency and output. The external resistor further reduces theses variations in voice coil current in exactly the same manner that the effects of voice coil heating are lessened in speakers using the invention.

Figure 15:
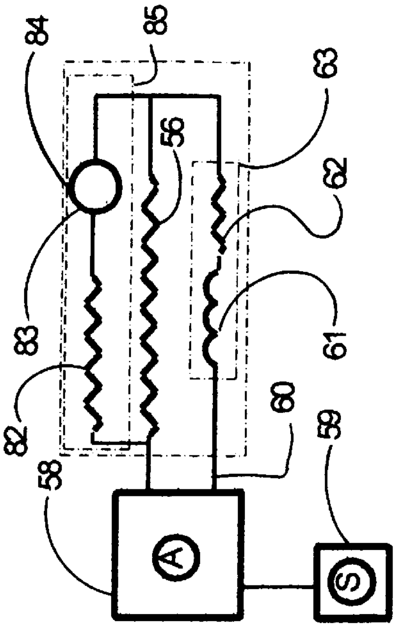
FIG. 15 shows a method of using the invention to compensate for inadequacies within the speaker.

The invention allows another aspect of loudspeaker distortion to be corrected. FIG. 15 shows an embodiment of the invention that utilizes a correction circuit 85 in parallel with series resistor 56. This correction circuit consists of a circuit comprised of a resistor 82 used in conjunction with a corrective circuit 83. Circuit 83 may be solely reactive or reactive and resistive in combination. With proper design it is possible to choose circuit values for components comprising corrective circuit 83 such that an increase of signal voltage in certain frequency ranges will be placed across voice coil 63 shown in FIG. 15. This will increase the sound output in these frequency bands.

Such increase can be needed due to flaws in speaker cone radiating assembly 37 shown in FIG. 1. In this assembly, as in any assembly of moving parts, there will inevitably be mechanical resonances. These can affect the speaker's output of sound. An example of extreme resonance peak 75 is shown in FIG. 12 in the response of a well regarded commercially available electro-dynamic loudspeaker. Also shown in FIG. 12 is an example of resonance dip 76 of smaller magnitude in the response of the speaker.

Figure 16:
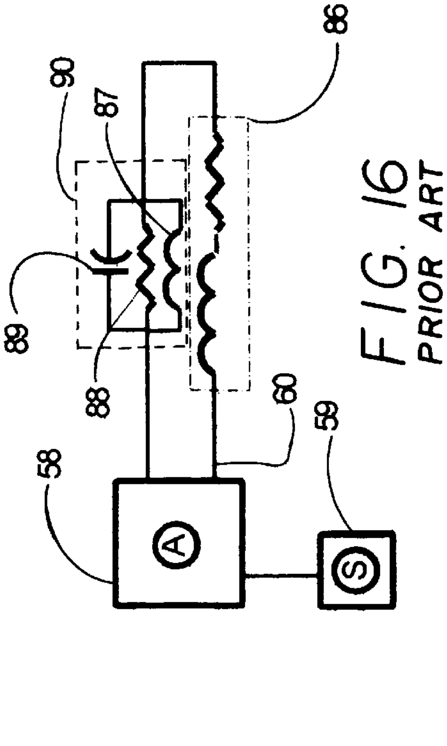
FIG. 16 PRIOR ART
FIG. 16 shows an example of a compensation circuit network used currently to alter electro-dynamic loudspeakers.

It is possible to correct a frequency response error of increased output as exemplified by resonance peak 75 shown in FIG. 12 with resistive and reactive elements placed in a circuit. FIG. 16 shows a simple example of such a correcting circuit placed in series with a conventional dynamic loudspeaker. At the frequency where the impedance of a capacitor 89 equals the impedance of an inductor 87 the combined impedance of a parallel network 90 will equal the resistance of a resistor 88. At frequencies either much larger or smaller than the frequency at which the impedance of 89 equals that of 87 the impedance of network 90 will be very small. If elements 89 and 87 are chosen such that the frequency at which the two impedances of 89 and 87 are equal is designed to be 4,000 Hz and resistor 86 is about 16 ohms network 90 can smooth the response of the Audax speaker whose response is shown in FIG. 12 if network 90 so designed is placed in series with the Audax speaker. The exact values of reactor 89 and 87 can be chosen so that the errors in response due to the resonances that give rise to peak 75 in FIG. 12 are almost entirely eliminated.

It is not so simple to eliminate a dip in response such as 76 shown in FIG. 12. This can be explained with reference to FIG. 17. This shows idealized frequency response 51 of a speaker similar to that shown in FIG. 5. Also illustrated is a resonance peak 91 and a resonance dip 92, both centered at 1,000 Hz. Either of these resonances can and do exist in electro-dynamic loudspeakers.

Figure 18:
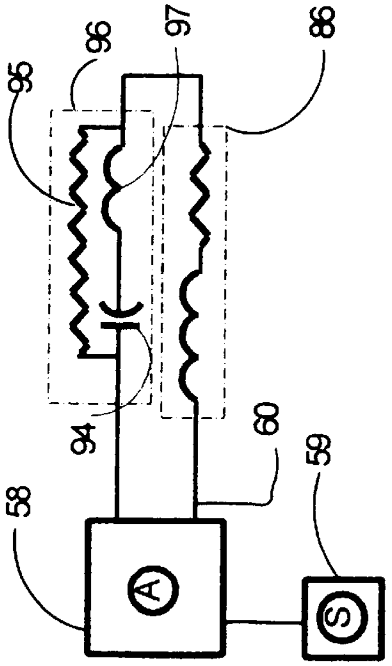
FIG. 18 PRIOR ART
FIG. 18 shows a typical compensation network used to cure a response dip in a conventional speaker.

As noted above, when a speaker exhibits a resonance peak such as shown as 91 in FIG. 18, a network similar to that illustrated in FIG. 16 can be used to suppress the peak and produce a level response similar to that shown as 51 in FIG. 5.

Figure 17:
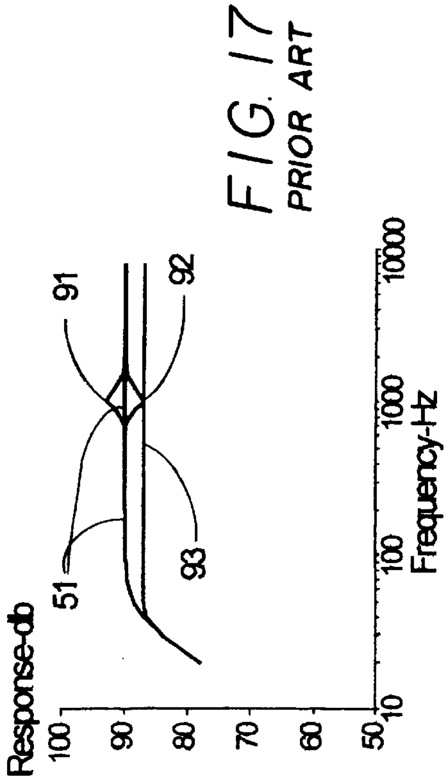
FIG. 17 PRIOR ART
FIG. 17 shows idealized examples of frequency response variations that can be corrected with use of the modified invention shown in FIG. 19.

It is not as simple to cure a dip 92 in the response in FIG. 17 and 76 in FIG. 12. If a network 96 shown in FIG. 17 and consisting of a resistor 95, an inductor 97 and a capacitor 94 is used with a conventional speaker, a response 93 in FIG. 17 is the best that can be achieved. Although this is a level response the amplitude of the response, and thus the sensitivity of the speaker, is reduced by the amount of the dip. In actual fact even this is not achievable. The response will be less than the bottom of dip 92 due to unavoidable compromises that must occur in the correction network. Such factors as the necessity of having resistance in the wire that is used to wind inductance 97 shown in FIG. 18 is one compromise. Resistance is also inevitably encountered in real capacitors.

Figure 19:
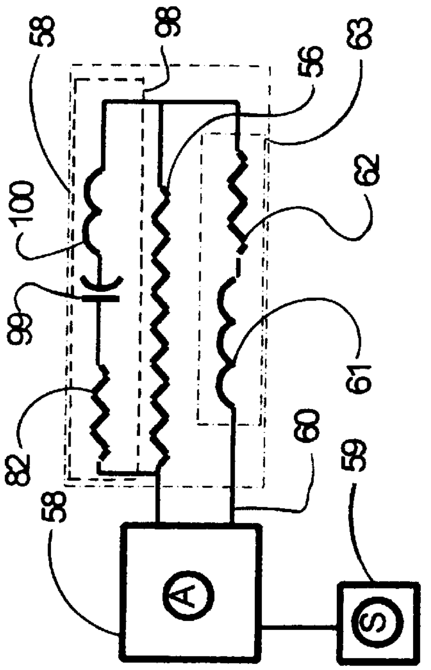
FIG. 19 shows a method of using the invention to incorporate a correction network that can correct variations in the frequency response of a dynamic speaker using the invention.

If a circuit network 98 shown in FIG. 19 is used with a speaker using the invention and the values of a capacitor 99, an inductance 100 and resistor 82 are chosen correctly dip 92 in FIG. 17 can be entirely smoothed out and the response will be that shown as 51 in FIG. 4 and FIG. 17. The compromises that required a response below the minimum of dip 92 can be compensated for because series resistor 56 can be designed to provide the desired amount of speaker sensitivity. The requirement for resistance in inductor 100 can be made up with a change in the value of resistor 82. This simple adjustment is not possible in the circuit of FIG. 18.

Figure 20:
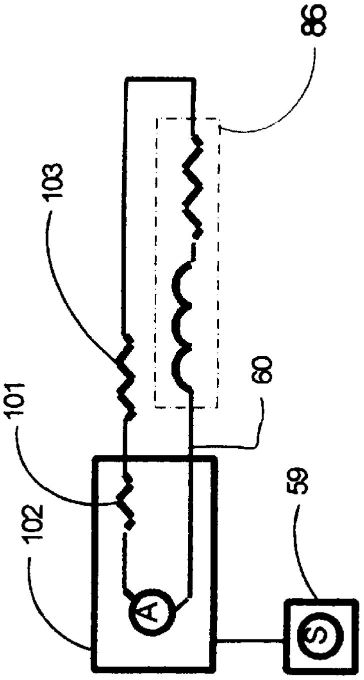
FIG. 20 shows the invention using the output impedance of the driving amplifier as part on the added resistor.

The function of resistor 56 can be duplicated by the output impedance of the amplifier that drives the speaker. FIG. 20 shows this application of a system comprised of an amplifier 102 having an output impedance 101. This impedance can be combined with an external resistor 103 chosen such that the sum of resistor 103 and the output impedance of amplifier 102 adds to the correct value to complement the value of $(Bl)^2/R_{VC}$ associated with voice coil 86 so that the value of $(Bl)^2/(R_{VC}+R_{101}+R_{103})$ is between the values of about 1.4 and 2.0. $R_{101}$ is the impedance of amplifier 102 and $R_{103}$ is the resistance of resistor 103. It is possible to have the output impedance of amplifier 102 be large enough to be used alone so that the value of $R_{103}$ would be zero in this case.

Although various arrangements and modifications have been discussed above, it will be appreciated that the invention is not limited thereto but encompasses all forms and variations falling within the scope of the appended claims.

What is claimed is:

1. A system to minimize the audible effects of voice coil heating and consequent resistance change, inductance and interaction between voice coil and central pole piece in an electro-dynamic loudspeaker, including a magnetic circuit, designed to provide reproduced sound when driven by an audio amplifier comprising:

resistor means wired in series with the voice coil of said electrodynamic loudspeaker said resistor means being thermally independent of the voice coil such that heat generated in the series resistor does not appreciably increase the temperature of the voice coil in such degree as to affect the voice coil's resistance; and wherein the resistive sum of the resistor means and the voice coil impedance during operation is substantially equal to the operating impedance of the speaker and the operating impedance is substantially constant during all conditions of operation.

2. The invention as set forth in claim 1 above, wherein said resistor means wired in series with said voice coil is fabricated of a material displaying a negative temperature-resistance coefficient.

3. The invention as set forth in claim 1 above, wherein said resistor means wired in series with said voice coil is fabricated of one or more diodes having a negative temperature-resistance characteristic.

4. The invention as set forth in claim 1 above, wherein said resistor means wired in series with said voice coil is static and disposed so that said resistor means does not move during operation of said loudspeaker.

5. A system to minimize the audible effects of voice coil heating and consequent resistance change, inductance and interaction between voice coil and central pole piece in an electro-dynamic loudspeaker, including a magnetic circuit, designed to provide reproduced sound when driven by an audio amplifier comprising:

resistor means wired in series with said voice coil of said electrodynamic loudspeaker, said resistor means being thermally independent of said voice coil such that heat generated in said resistor means does not appreciably increase the temperature of said voice coil in such degree as to affect the resistance of said voice coil; and wherein the resistive sum of said resistance of said resistor means and the impedance of said voice coil during operation is substantially equal to the operating impedance of said loudspeaker and said operating impedance is substantially constant under all conditions of operation, wherein said resistor means wired in series with said voice coil is fabricated solely of material or materials displaying a neutral temperature-resistance coefficient and does not include any circuit element wired in parallel with said resistor means fabricated of materials displaying a positive temperature-resistance coefficient.

6. A system to minimize the audible effects of voice coil heating and consequent resistance change, inductance and interaction between voice coil and central pole piece in an electro-dynamic loudspeaker, including a magnetic circuit, designed to provide reproduced sound when driven by an audio amplifier comprising:

resistor means wired in series with said voice coil of said electrodynamic loudspeaker, said resistor means being thermally independent of said voice coil such that heat generated in said resistor means does not appreciably increase the temperature of said voice coil in such degree as to affect the resistance of said voice coil; and wherein the resistive sum of said resistance of said resistor means and the impedance of said voice coil during operation is substantially equal to the operating impedance of said loudspeaker and said operating impedance is substantially constant under all conditions of operation, wherein said resistor means wired in series with said voice coil is fabricated of carbon resistors.

7. A system to minimize the audible effects of voice coil heating and consequent resistance change, inductance and interaction between voice coil and central pole piece in an electro-dynamic loudspeaker, including a magnetic circuit, designed to provide reproduced sound when driven by an audio amplifier comprising:

resistor means wired in series with said voice coil of said electrodynamic loudspeaker, said resistor means being thermally independent of said voice coil such that heat generated in said resistor means does not appreciably increase the temperature of said voice coil in such degree as to affect the resistance of said voice coil; and wherein the resistive sum of said resistance of said resistor means and the impedance of said voice coil during operation is substantially equal to the operating impedance of said loudspeaker and said operating impedance is substantially constant under all conditions of operation, wherein said resistor means wired in series with said voice coil is made of wire disposed around in said magnetic circuit thereby reducing the inductance of said voice coil.

8. The invention as set forth in claim 7 above, wherein said resistor means wired in series with said voice coil is comprised, at least in part, of the output impedance of said amplifier used to drive said electrodynamic loudspeaker in a sound reproducing system.

9. The invention as set forth in claim 7 above, wherein said resistive sum of the resistor means and the voice coil impedance is between 4 ohms and 16 ohms during all conditions of operation.

10. A system to minimize the audible effects of voice coil heating, inductance and interaction between voice coil and central pole piece in an electro-dynamic loudspeaker, including a magnetic circuit, designed to provide reproduced sound when driven by an audio anplifier comprising:

system parameters chosen such that:

$$(Bl)^2/(R_{VC}M_{MD}2\pi f_{res})>2.0$$

Where B equals the magnetic flux density in the speaker's air gap in Teslas, l equals the length in meters of voice coil wire that is immersed in the magnetic field of the air gap, $R_{VC}$ is the resistance in ohms of the voice coil, $M_{MD}$ is equal to the moving mass in kilograms of the speaker and $f_{res}$ is equal to the resonance frequency in Herz of the speaker mounted in a system designed to radiate sound and;

resistor means wired in series with the voice coil disposed and/or connected such that heat generated in the series resistor does not appreciably increase the temperature of said voice coil in such degree as to affect said voice coil's resistance; the resistive sum of said resistor means and said voice coil impendace being set equal to the operating impedance of said speaker, the value of the electrical resistance of said resistor means chosen such that:

$$2.0 \geq \frac{(Bl)^2}{[(R_{VC}+R_{add})M_{MD}2\pi f_{res}]} \geq 1.4$$

where $R_{add}$ equals the electrical resistance of said resistor means.

11. The invention as set forth in claim 10 above, wherein said resistor means wired in series with said voice coil is fabricated of a material displaying a negative temperature-resistance coefficient.

12. The invention as set forth in claim 10 above, wherein said resistor means wired in series with said voice coil is fabricated of one or more diodes having a negative temperature-resistance characteristic.

13. The invention as set forth in claim 10 above, wherein said resistor means wired in series with said voice coil is fabricated of a material displaying a neutral temperature-resistance coefficient.

14. The invention as set forth in claim 10 above, wherein said resistor means wired in series with said voice coil is designed to be cooled by external means.

15. The invention as set forth in claim 10 above, wherein said resistor means wired in series with said voice coil is fabricated of at least one carbon resistor.

16. The invention as set forth in claim 10 above, wherein said resistor means wired in series with said voice coil is static and disposed so that said resistor means does not move during operation of said loudspeaker.

17. The invention as set forth in claim 10 above, wherein said resistor means wired in series with said voice coil is made of wire disposed around the magnetic circuit in such way as to counteract the magnetic field induced in magnetic circuit thereby reducing the inductance of said voice coil.

18. The invention as set forth in claim 10 above, wherein said resistor means wired in series with said voice coil is comprised, at least in part, of the output impedance of said amplifier used to drive said electrodynamic loudspeaker in a sound reproducing system.

19. The invention as set forth in claim 10 above, wherein the sum of said resistor means and the voice coil impedance is between 4 ohms and 16 ohms.

20. A system to minimize the audible effects of voice coil heating, inductance and interaction between voice coil and central pole piece in an electro-dynamic loudspeaker, including a magnetic circuit, providing reproduced sound when driven by an audio amplifier comprising:

resistor means wired in series with said voice coil and generating heat during operation, said resistor means and said voice coil being configured such that heat generated in said resistor means during operation does not appreciably increase the temperature of said voice coil in such degree as to affect the resistance of said voice coil; the resistive sum of said resistance of said resistor means and the impedance of said voice coil during operation being substantially equal to the operating impedance of said speaker and;

circuit means wired in parallel with at least a portion of said resistor means and designed to alter the signal voltage applied to said voice coil to overcome dips in the frequency response of said electro-dynamic loudspeaker.

21. The invention as set forth in claim 20 above, wherein said resistor wired in series with said voice coil is static and disposed so that said resistor does not move during operation of said loudspeaker.

22. The invention as set forth in claim 20 above, wherein said resistor wired in series with said voice coil is made of wire disposed around the magnetic circuit in such way as to counteract the magnetic field induced in magnetic circuit thereby reducing the inductance of said voice coil.

23. The invention as set forth in claim 20 above, wherein said resistor wired in series with said voice coil is at least in part comprised of the output impedance of said amplifier used to drive said electrodynamic loudspeaker in a sound reproducing system, said circuit means being wired in parallel with only at least part or all of the remaining said resistor.

24. The invention as set forth in claim 20 above wherein said operating impedance of the speaker is between 4 ohms and 16 ohms.

25. A system to minimize the audible effects of voice coil heating, inductance and interaction between voice coil and central pole piece in an electro-dynamic loudspeaker, including a magnetic circuit, providing reproduced sound when driven by an audio amplifier comprising:

resistor means wired in series with the voice coil and generating heat during operation, the resistor means and voice coil being configured such that heat generated in the resistor means during operation does not appreciably increase the temperature of the voice coil in such degree as to affect said voice coil's resistance; the resistive sum of said resistor means and said voice coil impedance during all conditions of operation being substantially equal to the operating impedance of said speaker and;

circuit means wired in parallel with at least a portion of said resistor means and designed to alter the signal voltage applied to said voice coil to overcome dips in the frequency response of said electro-dynamic loudspeaker, wherein said resistor means wired in series with said voice coil is fabricated of a material displaying a negative temperature-resistance coefficient.

26. A system to minimize the audible effects of voice coil heating, inductance and interaction between voice coil and central pole piece in an electro-dynamic loudspeaker, including a magnetic circuit, providing reproduced sound when driven by an audio amplifier comprising:

resistor means wired in series with the voice coil and generating heat during operation, the resistor means and voice coil being configured such that heat generated in the resistor means during operation does not appreciably increase the temperature of the voice coil in such degree as to affect said voice coil's resistance; the resistive sum of said resistor means and said voice coil impedance during all conditions of operation being substantially equal to the operating impedance of said speaker and;

circuit means wired in parallel with at least a portion of said resistor means and designed to alter the signal voltage applied to said voice coil to overcome dips in the frequency response of said electro-dynamic loudspeaker, wherein said resistor means wired in series with said voice coil is fabricated of one or more diodes having a negative temperature-resistance characteristic.

27. A system to minimize the audible effects of voice coil heating, inductance and interaction between voice coil and central pole piece in an electro-dynamic loudspeaker, including a magnetic circuit, providing reproduced sound when driven by an audio amplifier comprising:

resistor means wired in series with the voice coil and generating heat during operation, the resistor means and voice coil being configured such that heat generated in the resistor means during operation does not appreciably increase the temperature of the voice coil in such degree as to affect said voice coil's resistance; the resistive sum of said resistor means and said voice coil impedance during all conditions of operation being substantially equal to the operating impedance of said speaker and;

circuit means wired in parallel with at least a portion of said resistor means and designed to alter the signal voltage applied to said voice coil to overcome dips in the frequency response of said electro-dynamic loudspeaker, wherein said resistor means wired in series with said voice coil is fabricated of a material displaying a neutral temperature-resistance coefficient.

28. A system to minimize the audible effects of voice coil heating, inductance and interaction between voice coil and central pole piece in an electro-dynamic loudspeaker, including a magnetic circuit, providing reproduced sound when driven by an audio amplifier comprising:

resistor means wired in series with the voice coil and generating heat during operation, the resistor means and voice coil being configured such that heat generated in the resistor means during operation does not appreciably increase the temperature of the voice coil in such degree as to affect said voice coil's resistance; the resistive sum of said resistor means and said voice coil impedance during all conditions of operation being substantially equal to the operating impedance of said speaker and;

circuit means wired in parallel with at least a portion of said resistor means and designed to alter the signal voltage applied to said voice coil to overcome dips in the frequency response of said electro-dynamic loudspeaker, wherein said resistor means wired in series with said voice coil is fabricated of at least one carbon resistor.

* * * * *